US012652072B2

(12) United States Patent (10) Patent No.: US 12,652,072 B2

Aikawa et al. (45) Date of Patent: Jun. 9, 2026

(54) RADIO-FREQUENCY MODULE AND COMMUNICATION DEVICE

(71) Applicant: Murata Manufacturing Co., Ltd., Nagaokakyo (JP)

(72) Inventors: Kiyoshi Aikawa, Nagaokakyo (JP); Takanori Uejima, Nagaokakyo (JP); Hiromichi Kitajima, Nagaokakyo (JP); Takashi Yamada, Nagaokakyo (JP); Yoshihiro Daimon, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 327 days.

(21) Appl. No.: 18/477,561

(22) Filed: Sep. 29, 2023

(65) Prior Publication Data

US 2024/0030957 A1 Jan. 25, 2024

Related U.S. Application Data

(63) Continuation of application No. PCT/JP2022/010824, filed on Mar. 11, 2022.

(30) Foreign Application Priority Data

Mar. 31, 2021 (JP) ................................. 2021-060327

(51) Int. Cl.
| | |
|---|---|
| *H04B 1/00* | (2006.01) |
| *H03F 3/24* | (2006.01) |
| *H04B 1/38* | (2015.01) |

(52) U.S. Cl.
CPC ............... *H04B 1/38* (2013.01); *H03F 3/245* (2013.01); *H03F 2200/171* (2013.01); *H03F 2200/294* (2013.01); *H03F 2200/451* (2013.01)

(58) Field of Classification Search
CPC .. H04B 1/38; H04B 1/00; H04B 1/006; H03F 3/245; H03F 2200/171; H03F 2200/294;
(Continued)

(56) References Cited

U.S. PATENT DOCUMENTS

| | | | |
|---|---|---|---|
| 2020/0343930 A1 | 10/2020 | DiTommaso et al. | |
| 2021/0005578 A1* | 1/2021 | Matsumoto | ......... H01L 23/5384 |
| 2021/0050876 A1* | 2/2021 | Matsumoto | ......... H01L 23/5385 |

FOREIGN PATENT DOCUMENTS

| | | |
|---|---|---|
| JP | 2020-027974 A | 2/2020 |
| JP | 2020-126921 A | 8/2020 |

(Continued)

OTHER PUBLICATIONS

International Search Report and Written Opinion mailed on May 31, 2022, received for PCT Application PCT/JP2022/010824, filed on Mar. 11, 2022, 15 pages including English Translation.

*Primary Examiner* — Ping Y Hsieh

(74) *Attorney, Agent, or Firm* — XSENSUS LLP

(57) ABSTRACT

A radio-frequency module includes a module substrate having major surfaces opposite to each other; a module substrate having major surfaces opposite to each other, the major surface being disposed facing the major surface; a plurality of external connection terminals disposed on the major surface; a plurality of inter-substrate connection terminals disposed between the major surfaces to couple the module substrate to the module substrate; a first electronic component (integrated circuit) including a switch; a second electronic component including a filter coupled to a power amplifier via the switch; and a third electronic component including a filter coupled to the power amplifier via the switch. The first electronic component, the second electronic component, and the third electronic component are disposed in the same module substrate.

20 Claims, 3 Drawing Sheets

(58) Field of Classification Search
CPC ......... H03F 2200/451; H03F 2200/111; H03F
2203/7209; H03F 3/195; H03F 3/72;
H01L 23/00; H01L 25/00; H01L 25/065;
H01L 25/07; H01L 25/18
See application file for complete search history.

(56)                    References Cited

FOREIGN PATENT DOCUMENTS

| WO | 2019/065311 | A1 | 4/2019 |
| WO | 2019/181589 | A1 | 9/2019 |
| WO | 2020/022180 | A1 | 1/2020 |
| WO | 2020/071020 | A1 | 4/2020 |
| WO | 2020/261777 | A1 | 12/2020 |
| WO | 2021/002159 | A1 | 1/2021 |

* cited by examiner

FIG. 1

RADIO-FREQUENCY MODULE AND COMMUNICATION DEVICE

CROSS-REFERENCE TO RELATED APPLICATIONS

This is a continuation application of PCT/JP2022/010824, filed on Mar. 11, 2022, designating the United States of America, which is based on and claims priority to Japanese Patent Application No. JP 2021-060327 filed on Mar. 31, 2021. The entire contents of the above-identified applications, including the specifications, drawings and claims, are incorporated herein by reference in their entirety.

TECHNICAL FIELD

The present disclosure relates to a radio-frequency module and a communication device.

BACKGROUND ART

In mobile communication devices, such as cellular phones, radio-frequency front-end modules are becoming more and more complicated with an increasing number of bands to be supported in particular. Patent Document 1 discloses a technique to reduce the size of a radio-frequency module by using two module substrates.

CITATION LIST

Patent Document

Patent Document 1: International Publication No. WO 2020/022180

SUMMARY OF DISCLOSURE

Technical Problem

According to the aforementioned technique in the related art, however, a plurality of electronic components disposed on the two module substrates increase the number of inter-substrate connection terminals for coupling the two module substrates. This can make it difficult to reduce the size of the radio-frequency module.

An object of the present disclosure is to provide a radio-frequency module that can be reduced in size by reducing the number of inter-substrate connection terminals for coupling two module substrates, and to provide a communication device.

Solution to Problem

A radio-frequency module according to an aspect of the present disclosure includes: a first module substrate including a first major surface and a second major surface that are opposite to each other; a second module substrate including a third major surface and a fourth major surface that are opposite to each other, the third major surface being disposed facing the second major surface; a plurality of electronic components disposed between the second major surface and the third major surface, on the first major surface, and on the fourth major surface; a plurality of external connection terminals disposed on the fourth major surface; and a plurality of inter-substrate connection terminals disposed between the second major surface and the third major surface to couple the first module substrate to the second module substrate. The plurality of electronic components include a first electronic component including a first switch, a second electronic component including a first filter coupled to a power amplifier via the first switch, and a third electronic component including a second filter coupled to the power amplifier via the first switch. The first electronic component, the second electronic component, and the third electronic component are disposed in one of the first module substrate and the second module substrate.

Advantageous Effects of Disclosure

The radio-frequency module according to an aspect of the present disclosure can be reduced in size by reducing the number of inter-substrate connection terminals for coupling two module substrates.

BRIEF DESCRIPTION OF DRAWINGS

FIG. 1 is a circuit diagram of a radio-frequency circuit and a communication device according to an embodiment.

DESCRIPTION OF EMBODIMENTS

Figure 2:
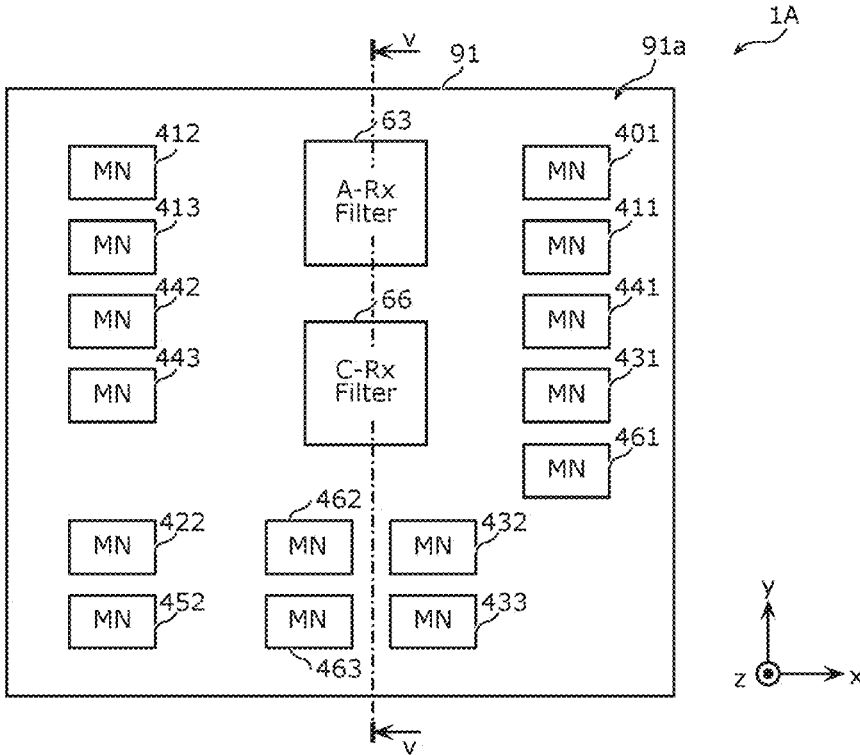
FIG. 2 is a plan view of a first major surface of a radio-frequency module according to an Example.

Hereinafter, an embodiment of the present disclosure is described in detail using the drawings. The embodiment described below illustrates a comprehensive or specific example. The numerical values, shapes, materials, constituent components, arrangements and connections of the constituent components, and the like described in the following embodiment are illustrative only and will not limit the present disclosure.

Each drawing is a schematic diagram including proper emphases, omissions, or adjustment of proportions in order to show the present disclosure and is not always illustrated exactly. The shapes, positional relationships, and proportions in each drawing are sometimes different from actual ones. In the drawings, substantially identical configurations are denoted by the same reference numerals, and redundant description may be omitted or simplified.

In each drawing below, x- and y-axes are orthogonal to each other on a plane parallel to the major surfaces of a module substrate. Specifically, when the module substrate is rectangular in a planar view, the x-axis is parallel to a first side of the module substrate, and the y-axis is parallel to a second side of the module substrate that is orthogonal to the first side. z-axis is vertical to the major surfaces of the module substrate, and the positive z-axis direction thereof is an upward direct while the negative z-axis direction is a downward direction.

In the circuit configuration of the present disclosure, "to be coupled" includes both being directly coupled with a connection terminal and/or a trace conductor or being electrically coupled via another circuit element. "To be coupled between A and B" indicates to be coupled to both A and B between A and B and includes, in addition to be coupled in series to a path connecting A and B, to be coupled in parallel between the path and ground (shunt connection).

In a component arrangement of the present disclosure, a "planar view" refers to a view of an object orthogonally projected onto an x-y plane as seen in the negative z-axis direction. "A overlaps B in a planar view" means that the region of A orthogonally projected onto the x-y plane overlaps the region of B orthogonally projected onto the x-y plane. "A is disposed between B and C" means that at least one of plural line segments connecting any point within B and any point within C passes through A. "A is joined to B" means that A is physically coupled to B. Terms indicating relationships between elements, such as "parallel" or "vertical", terms indicating element shapes, such as "rectangular", and numerical ranges express not only their exact meaning but also substantially equivalent ranges, for example, including several percent errors.

In component arrangements of the present disclosure, "a component is disposed in a substrate" includes the component being disposed on a major surface of the substrate and the component being disposed within the substrate. "A component is disposed on a major surface of a substrate" includes not only the component being disposed in contact with a major surface of the substrate but also the component being disposed on a major surface side without being in contact with the major surface (for example, the component is stacked atop another component disposed in contact with the major surface). In addition, "a component is disposed on a major surface of a substrate" may include the component being within a recess formed in the major surface. "A component is disposed within a substrate" means that the component is encapsulated within the module substrate and does not include either of the component being fully disposed between the major surfaces of the substrate but being partially exposed from the substrate or the component being partially disposed within the substrate. "A component is disposed between two major surfaces" includes not only the component being disposed in contact with both the two major surfaces but also the component being disposed in contact with only one of the two major surfaces or disposed without being in contact with either of the two major surfaces.

(Embodiment)

[1 Circuit Configuration of Radio-Frequency Circuit 1 and Communication Device 5]

Figure 1:
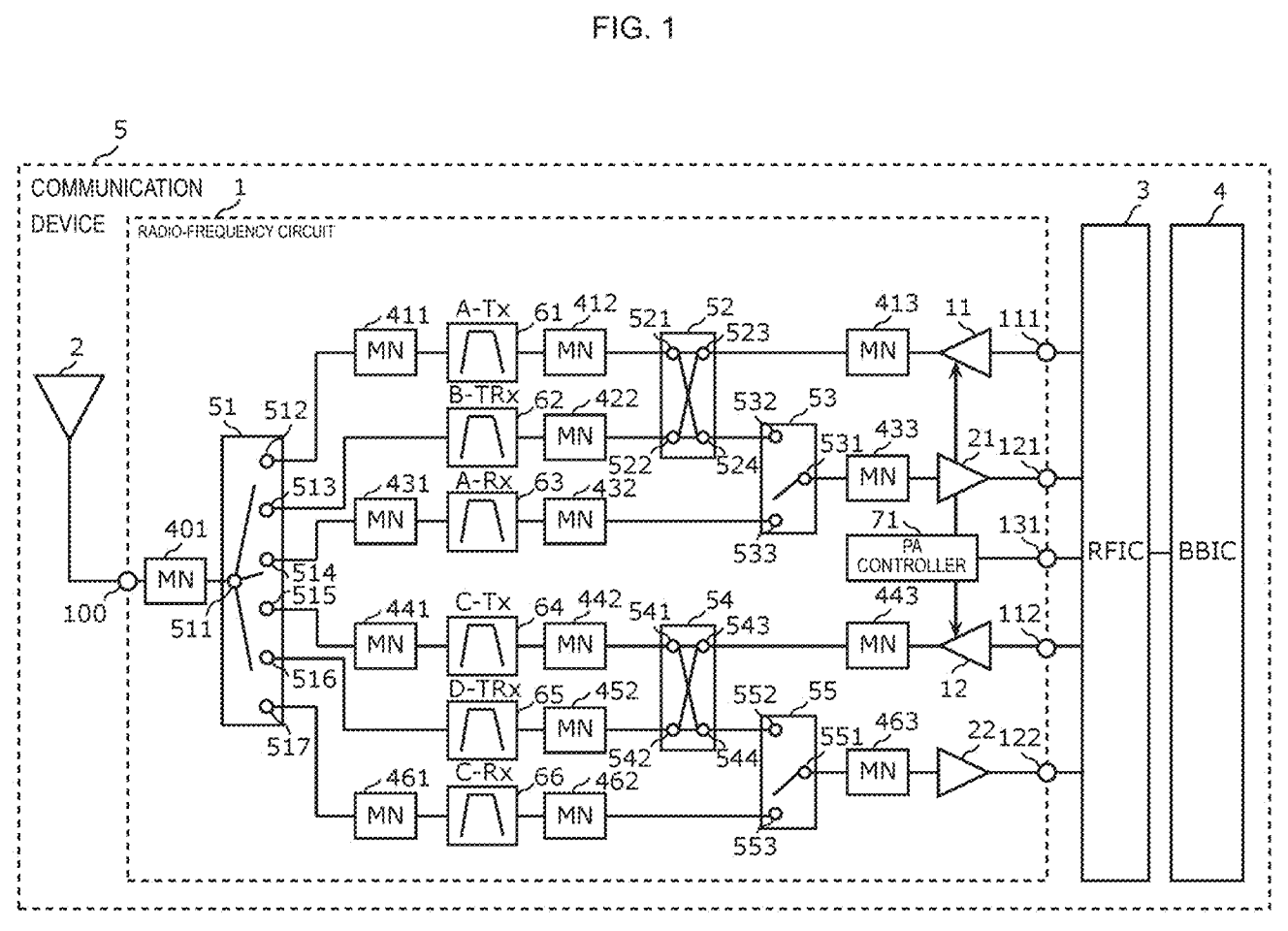

The circuit configurations of a radio-frequency circuit 1 and a communication device 5 according to an embodiment are described with reference to FIG. 1. FIG. 1 is a circuit diagram of the radio-frequency circuit 1 and communication device 5 according to the embodiment.

[1.1 Circuit Configuration of Communication Device 5]

First, the circuit configuration of the communication device 5 is described. As illustrated in FIG. 1, the communication device 5 according to the embodiment includes the radio-frequency circuit 1, an antenna 2, a radio frequency integrated circuit (RFIC) 3, and a baseband integrated circuit (BBIC) 4.

The radio-frequency circuit 1 transfers radio-frequency signals between the antenna 2 and the RFIC 3. The internal configuration of the radio-frequency circuit 1 is described later.

The antenna 2 is coupled to an antenna connection terminal 100 of the radio-frequency circuit 1. The antenna 2 transmits a radio-frequency signal outputted from the radio-frequency circuit 1. The antenna 2 receives a radio-frequency signal from the outside and outputs the received radio-frequency signal to the radio-frequency circuit 1.

The RFIC 3 is an example of a signal processing circuit to process radio-frequency signals. Specifically, the RFIC 3 performs signal processing, such as down-conversion, for a radio-frequency reception signal inputted through a reception path of the radio-frequency circuit 1 and outputs to the BBIC 4, the reception signal generated through the signal processing. The RFIC 3 performs signal processing, such as up-conversion, for a transmission signal inputted from the BBIC 4 and outputs a radio-frequency transmission signal generated by the signal processing to a transmission path of the radio-frequency circuit 1. The RFIC 3 includes a controller to control switches, amplifiers, and other elements included in the radio-frequency circuit 1. Part of or all of the functions of the RFIC 3 as a controller may be implemented outside the RFIC 3 and, for example, may be implemented in the BBIC 4 or the radio-frequency circuit 1.

The BBIC 4 is a baseband signal processing circuit that performs signal processing using an intermediate frequency band lower than frequencies of radio-frequency signals transferred by the radio-frequency circuit 1. Examples of the signals to be processed by the BBIC 4 are image signals for image display and/or audio signals for voice calls using a speaker.

In the communication device 5 according to the embodiment, the antenna 2 and BBIC 4 are optional constituent elements.

[1.2 Circuit Configuration of Radio-Frequency Circuit 1]

Next, the circuit configuration of the radio-frequency circuit 1 is described. As illustrated in FIG. 1, the radio-frequency circuit 1 includes power amplifiers (PAs) 11 and 12, low-noise amplifiers (LNAs) 21 and 22, matching networks (MN) 401, 411 to 413, 422, 431 to 433, 441 to 443, 452, and 461 to 463, switches (SWs) 51 to 55, filters 61 to 66, a PA controller (PAC) 71, the antenna connection terminal 100, radio-frequency input terminals 111 and 112, radio-frequency output terminals 121 and 122, and control terminal 131. Hereinafter, the constituent elements of the radio-frequency circuit 1 are described sequentially.

The antenna connection terminal 100 is coupled to the antenna 2 outside the radio-frequency circuit 1.

Each of the radio-frequency input terminals 111 and 112 is a terminal to receive radio-frequency transmission signals from the outside of the radio-frequency circuit 1. In the embodiment, the radio-frequency input terminals 111 and 112 are coupled to the RFIC 3 outside the radio-frequency circuit 1.

Each of the radio-frequency output terminals 121 and 122 is a terminal to supply radio-frequency reception signals to the outside of the radio-frequency circuit 1. In the embodiment, the radio-frequency output terminals 121 and 122 are coupled to the RFIC 3 outside the radio-frequency circuit 1.

The control terminal 131 is a terminal to transfer control signals. Specifically, the control terminal 131 is the terminal to receive control signals from the outside of the radio-frequency circuit 1 and/or terminals to supply control signals to the outside of the radio-frequency circuit 1. The control signals are signals concerning control of electronic circuits included in the radio-frequency circuit 1. Specifically, the control signals are digital signals to control at least one of the power amplifiers 11 and 12, low-noise amplifiers 21 and 22, and switches 51 to 55, for example. The radio-frequency circuit 1 is able to receive digital signals to control the power amplifiers 11 and 12 from the RFIC 3 via the control terminal 131.

The power amplifier 11 is coupled between the radio-frequency input terminal 111 and the filters 61 and 62 and is able to amplify transmission signals in bands A and B. Specifically, the input end of the power amplifier 11 is coupled to the radio-frequency input terminal 111. The output end of the power amplifier 11 is coupled to the filter 61 via the matching network 413, switch 52, and matching network 412. The output end of the power amplifier 11 is also coupled to the filter 62 via the matching network 413, switch 52, and matching network 422.

The power amplifier 12 is coupled between the radio-frequency input terminal 112 and the filters 64 and 65 and is able to amplify transmission signals in bands C and D. Specifically, the input end of the power amplifier 12 is coupled to the radio-frequency input terminal 112. The output end of the power amplifier 12 is coupled to the filter 64 via the matching network 443, switch 54, and matching network 442. The output end of the power amplifier 12 is also coupled to the filter 65 via the matching network 443, switch 54, and matching network 452.

The power amplifiers 11 and 12 are electronic components that provide an output signal having a larger energy than an input signal (a transmission signal) based on power supplied from a power supply. Each of the power amplifiers 11 and 12 includes an amplification transistor and may further include an inductor and/or a capacitor. The internal configuration of the power amplifiers 11 and 12 are not limited. For example, each of the power amplifiers 11 and 12 may be a multistage amplifier, a differential amplifier, or a Doherty amplifier.

The power amplifier 11 may support a first power class that allows a maximum output power of higher than that of a second power class. In this case, the power amplifier 11 is able to amplify a transmission signal to a power that meets the maximum output power allowed by the first power class. The power amplifier 12 may support the second power class that allows a maximum output power of lower than that of the first power class. In this case, the power amplifier 12 is able to amplify a transmission signal to a power that meets the maximum output power allowed by the second power class.

The power classes are classifications of the output power of a terminal defined by the maximum output power or the like. A smaller power class number indicates that the terminal covers a higher output power. For example, in 3GPP, the maximum output power of power class 1 is 31 dBm; power class 1.5, 29 dBm; power class 2, 26 dBm; and power class 3, 23 dBm.

The maximum output power of a terminal is defined by output power at an antenna end of the terminal. The maximum output power of the terminal is measured by a method defined by 3GPP or the like, for example. In FIG. 1, for example, the measurement of the maximum output power is carried out by measuring radiated power at the antenna 2. Instead of measuring the radiated power, the output power of the antenna 2 can be measured by providing a terminal near the antenna 2 and connecting measurement equipment (a spectrum analyzer, for example) to the terminal.

The power class supported by a power amplifier can be specified by the maximum output power of the power amplifier. For example, the maximum output power of a power amplifier supporting power class 1 is greater than 31 dBm. Generally, the maximum output power of a power amplifier depends on the size and semiconductor material of the semiconductor device constituting the power amplifier. For example, the size of a semiconductor device increases with the maximum output power thereof. In some cases, therefore, comparing the sizes of semiconductor devices of two power amplifiers composed of the same semiconductor material provides a relative comparison between power classes supported by the two power amplifiers. For example, some semiconductor devices constituting power amplifiers of high maximum output power are made of a special semiconductor material for high power (for example, gallium nitride (GaN), silicon carbide (SiC), or the like). In some case, therefore, comparing the semiconductor materials used in two semiconductor devices provides a relative comparison between power classes supported by the two power amplifiers.

The low-noise amplifier 21 is coupled between the filter 62 and 63 and the radio-frequency output terminal 121 and is able to amplify reception signals in the bands A and B. Specifically, the input end of the low-noise amplifier 21 is coupled to the filter 62 via the matching network 433, switches 53 and 52, and matching network 422. The input end of the low-noise amplifier 21 is also coupled to the filter 63 via the matching network 433, switch 53, and matching network 432. The output end of the low-noise amplifier 21 is coupled to the radio-frequency output terminal 121.

In the embodiment, the filters 62 and 63 are coupled to the same low-noise amplifier 21 but are not limited to this. For example, the filters 62 and 63 may be coupled to different low-noise amplifiers. In this case, the radio-frequency circuit 1 may or may not include the switch 53.

The low-noise amplifier 22 is coupled between the filters 65 and 66 and the radio-frequency output terminal 122 and is able to amplify reception signals in the bands C and D. Specifically, the input end of the low-noise amplifier 22 is coupled to the filter 65 via the matching network 463, switches 55 and 54, and matching network 452. The input end of the low-noise amplifier 22 is also coupled to the filter 66 via the matching network 463, switch 55, and matching network 462. The output end of the low-noise amplifier 22 is coupled to the radio-frequency output terminal 122.

The low-noise amplifiers 21 and 22 are electronic components that provide an output signal having a larger energy than that of an input signal (a reception signal) based on power supplied from the power supply. Each of the low-noise amplifiers 21 and 22 includes an amplification transistor and may further include an inductor and/or a capacitor. The internal configurations of the low-noise amplifiers 21 and 22 are not limited.

Each of the matching networks 401, 411 to 413, 422, 431 to 433, 441 to 443, 452, and 461 to 463 is coupled between two circuit elements and is able to provide impedance matching between the two circuit elements. Thus, each of the matching networks 401, 411 to 413, 422, 431 to 433, 441 to 443, 452, and 461 to 463 is an impedance matching network. Each of the matching networks 401, 411 to 413, 422, 431 to 433, 441 to 443, 452, and 461 to 463 includes an inductor and may further include a capacitor.

The switch 51 is an example of a second switch and is coupled between the antenna connection terminal 100 and the filters 61 to 66. The switch 51 includes terminals 511 to 517. The terminal 511 is coupled to the antenna connection terminal 100. The terminal 512 is coupled to the filter 61 via the matching network 411. The terminal 513 is coupled to the filter 62. The terminal 514 is coupled to the filter 63 via the matching network 431. The terminal 515 is coupled to the filter 64 via the matching network 441. The terminal 516 is coupled to the filter 65. The terminal 517 is coupled to the filter 66 via the matching network 461.

In this connection configuration, the switch 51 is able to connect the terminal 511 to at least one of the terminals 512 to 517 based on a control signal from the RFIC 3, for example. The switch 51 is able to switch whether to couple the antenna connection terminal 100 to each of the filters 61 to 66. The switch 51 is composed of a multi-connection switch circuit, for example, and is sometimes referred to as an antenna switch.

The switch 52 is an example of a first switch. The switch 52 is coupled between the output end of the power amplifier 11 and the filters 61 and 62 and is coupled between the input end of the low-noise amplifier 21 and the filter 62. The switch 52 includes terminals 521 to 524. The terminal 521 is coupled to the filter 61 via the matching network 412. The terminal 522 is coupled to the filter 62 via the matching network 422. The terminal 523 is coupled to the output end of the power amplifier 11 via the matching network 413. The terminal 524 is coupled to the input end of the low-noise amplifier 21 via the switch 53 and matching network 433.

In this connection configuration, the switch 52 is able to couple the terminal 523 to at least one of the terminals 521 and 522 and couple the terminal 522 to at least one of the terminals 523 and 524 based on a control signal from the RFIC 3, for example. The switch 52 is able to switch whether to couple the power amplifier 11 to each of the filters 61 and 62 and is able to switch connections between the filter 62 and the power amplifier 11 and between the filter 62 and the low-noise amplifier 21. The switch 52 is composed of a multi-connection switch circuit, for example.

The switch 53 is an example of a third filter. The switch 53 is coupled between the input end of the low-noise amplifier 21 and the filters 62 and 63. The switch 53 includes terminals 531 to 533. The terminal 531 is coupled to the input end of the low-noise amplifier 21 via the matching network 433. The terminal 532 is coupled to the terminal 524 of the switch 52 and is coupled to the filter 62 via the switch 52 and matching network 422. The terminal 533 is coupled to the filter 63 via the matching network 432.

In this connection configuration, the switch 53 is able to couple the terminal 531 to at least one of the terminals 532 and 533 based on a control signal from the RFIC 3, for example. The switch 53 is thus able to switch whether to couple the low-noise amplifier 21 to each of the filters 62 and 63. The switch 53 is composed of a multi-connection switch circuit, for example.

The switch 54 is coupled between the output end of the power amplifier 12 and the filters 64 and 65 and is coupled between the input end of the low-noise amplifier 22 and the filter 65. The switch 54 includes terminals 541 to 544. The terminal 541 is coupled to the filter 64 via the matching network 442. The terminal 542 is coupled to the filter 65 via the matching network 452. The terminal 543 is coupled to the output end of the power amplifier 12 via the matching network 443. The terminal 544 is coupled to the input end of the low-noise amplifier 22 via the switch 55 and matching network 463.

In this connection configuration, the switch 54 is able to couple the terminal 543 to at least one of the terminals 541 and 542 and couple the terminal 542 to either the terminal 543 or 544 based on a control signal from the RFIC 3, for example. The switch 54 is thus able to switch whether to couple the power amplifier 12 to each of the filters 64 and 65 and switch connections between the filter and the power amplifier 12 and between the filter 65 and the low-noise amplifiers 22. The switch 54 is composed of a multi-connection switch circuit, for example.

The switch 55 is coupled between the input end of the low-noise amplifier 22 and the filters 65 and 66. The switch 55 includes terminals 551 to 553. The terminal 551 is coupled to the input end of the low-noise amplifier 22 via the matching network 463. The terminal 552 is coupled to the terminal 544 of the switch 54 and is coupled to the filter 65 via the switch 54 and matching network 452. The terminal 553 is coupled to the filter 66 via the matching network 462.

In this connection configuration, the switch 55 is able to couple the terminal 551 to at least one of the terminals 552 and 553 based on a control signal from the RFIC 3, for example. The switch 55 is thus able to switch whether to couple the low-noise amplifier 22 to each of the filters 65 and 66. The switch 55 is composed of a multi-connection switch circuit, for example.

The filter 61 (A-Tx) is an example of the first filter. The filter 61 is coupled between the power amplifier 11 and the antenna connection terminal 100. Specifically, an end of the filter 61 is coupled to the antenna connection terminal 100 via the matching network 411, switch 51, and matching network 401. The other end of the filter 61 is coupled to the output end of the power amplifier 11 via the matching network 412, switch 52, and matching network 413. The filter 61 has a pass band including an uplink operation band of the band A for frequency division duplex (FDD) and is able to pass transmission signals in the band A.

The filter 62 (B-TRx) is an example of a second filter. The filter 62 is coupled between the antenna connection terminal 100 and the power amplifier 11 and is coupled between the antenna connection terminal 100 and the low-noise amplifier 21. Specifically, an end of the filter 62 is coupled to the antenna connection terminal 100 via the switch 51 and matching network 401. The other end of the filter 62 is coupled to the output end of the power amplifier 11 via the matching network 422, switch 52, and matching network 413 and is coupled to the input end of the low-noise amplifier 21 via the matching network 422, switches 52 and 53, and matching network 433. The filter 62 has a pass band including the band B for time division duplex (TDD) and is able to pass transmission and reception signals in the band B. The band B can transmit in conjunction with the band A. The band B can not transmit in conjunction with the band A.

The filter 63 (A-Rx) is an example of the third filter and is coupled between the low-noise amplifier 21 and the antenna connection terminal 100. Specifically, an end of the filter 63 is coupled to the antenna connection terminal 100 via the matching network 431, switch 51, and matching network 401. The other end of the filter 63 is coupled to the input end of the low-noise amplifier 21 via the matching network 432, switch 53, and matching network 433. The filter 63 has a pass band including a downlink operation band of the band A for FDD and is able to pass reception signals in the band A.

The filter 64 (C-Tx) is coupled between the power amplifier 12 and the antenna connection terminal 100. Specifically, an end of the filter 64 is coupled to the antenna connection terminal 100 via the matching network 441, switch 51, and matching network 401. The other end of the filter 64 is coupled to the output end of the power amplifier 12 via the matching network 442, switch 54, and matching network 443. The filter 64 has a pass band including an uplink operation band of the band C for FDD and is able to pass transmission signals in the band C.

The filter 65 (D-TRx) is coupled between the antenna connection terminal 100 and the power amplifier 12 and is coupled between the antenna connection terminal 100 and the low-noise amplifier 22. Specifically, an end of the filter 65 is coupled to the antenna connection terminal 100 via the switch 51 and matching network 401. The other end of the filter 65 is coupled to the output end of the power amplifier 12 via the matching network 452, switch 54, and matching network 443 and is coupled to the input end of the low-noise amplifier 22 via the matching network 452, switches 54 and 55, and matching network 463. The filter 65 has a pass band including the band D for TDD and is able to pass transmission and reception signals in the band D.

The filter 66 (C-Rx) is coupled between the low-noise amplifier 22 and the antenna connection terminal 100. Specifically, an end of the filter 66 is coupled to the antenna connection terminal 100 via the matching network 461, switch 51, and matching network 401. The other end of the filter 66 is coupled to the input end of the low-noise amplifier 22 via the matching network 462, switch 55, and matching network 463. The filter 66 has a pass band including a downlink operation band of the band C for FDD and is able to pass reception signals in the band C.

The PA controller 71 is able to control the power amplifiers 11 and 12. For example, the PA controller 71 receives digital control signals from the RFIC 3 via the control terminal 131 and outputs control signals to the power amplifiers 11 and 12.

The bands A to D are frequency bands for communication systems built by using a radio access technology (RAT). The bands A to D are previously defined by a standards body or the like (the 3rd Generation Partnership Project (3GPP) or the Institute of Electrical and Electronics Engineers (IEEE), for example). Examples of the communication systems are a 5th generation new radio (5GNR) system, a long term evolution (LTE) system, and a wireless local area network (WLAN) system.

The bands A and B may be included in a different band group from the bands C and D or may be included in the same band group. Herein, a band group indicates a range of frequencies including plural bands. Band groups can be an ultra-high band group (3300 to 5000 MHz), a high-band group (2300 to 2690 MHz), a mid-band group (1427 to 2200 MHz), and a low-band group (698 to 960 MHz), for example, but are not limited thereto. For example, the band groups may include a band group including an unlicensed band not lower than 5 GHz or a band group in the millimeter wave band.

For example, the bands A and B may be included in the high-band group while the bands C and D are included in the mid-band group. Alternatively, the bands A and B may be included in the mid- or high-band group while the bands C and D are included in the low-band group.

The radio-frequency circuit 1 is illustrated by way of example in FIG. 1 and is not limited thereto. For example, the bands covered by the radio-frequency circuit 1 are not limited to the bands A to D. For example, the radio-frequency circuit 1 may be configured to cover five bands or more. In this case, the radio-frequency circuit 1 may include filters for bands E, F, G . . . . Alternatively, for example, the radio-frequency circuit 1 may be configured to cover only the bands A and B but not the bands C and D. In this case, the radio-frequency circuit 1 may or may not include the power amplifier 12, low-noise amplifier 22, matching networks 441 to 443, 452, and 461 to 463, radio-frequency input terminal 112, and radio-frequency output terminal 122.

The radio-frequency circuit 1 may or may not include all the matching networks 401, 411 to 413, 422, 431 to 433, 441 to 443, 452, and 461 to 463. Furthermore, the radio-frequency circuit 1 may be coupled to plural antennas and may include plural antenna connection terminals, for example. The radio-frequency circuit 1 may include more radio-frequency input terminals. In this case, a switch that is able to switch connections between the power amplifiers and the plural radio-frequency input terminals may be provided between the power amplifiers and the plural radio-frequency input terminals. The radio-frequency circuit 1 may include more radio-frequency output terminals. In this case, a switch that is able to switch connections between the low-noise amplifiers and the plural radio-frequency output terminals may be provided between the low-noise amplifiers and the plural radio-frequency output terminals.

[2 Example of Radio-Frequency Circuit 1]

As Example 1 of the radio-frequency circuit 1 according to the embodiment, a radio-frequency module 1A, in which the radio-frequency circuit 1 is implemented, is described with reference to FIGS. 2 to 5.

[2.1 Component Arrangement of Radio-Frequency Module 1A]

Figure 3:
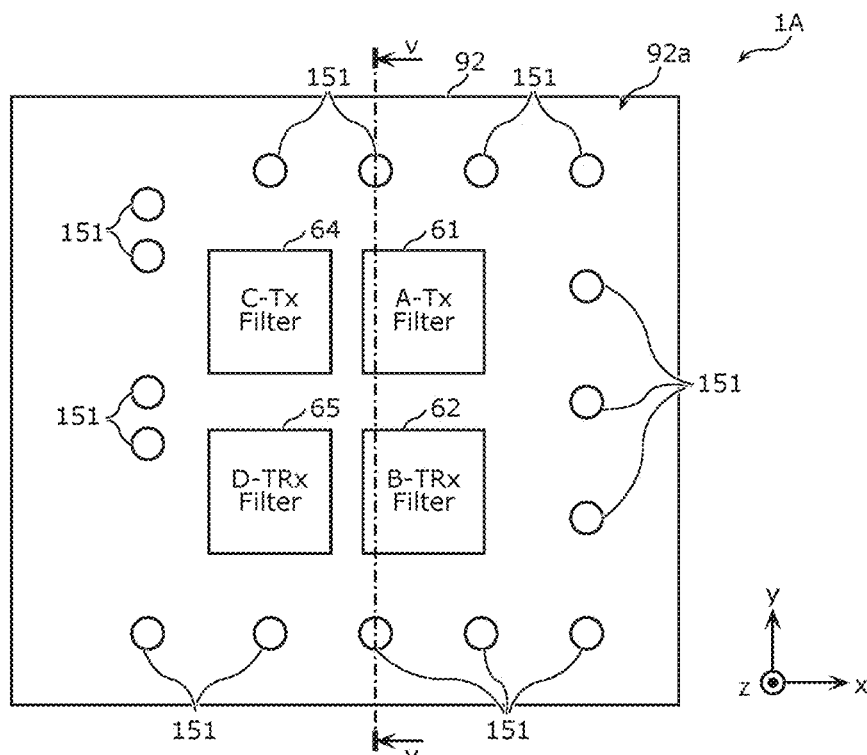
FIG. 3 is a plan view of a third major surface of the radio-frequency module according to the Example.
Figure 4:
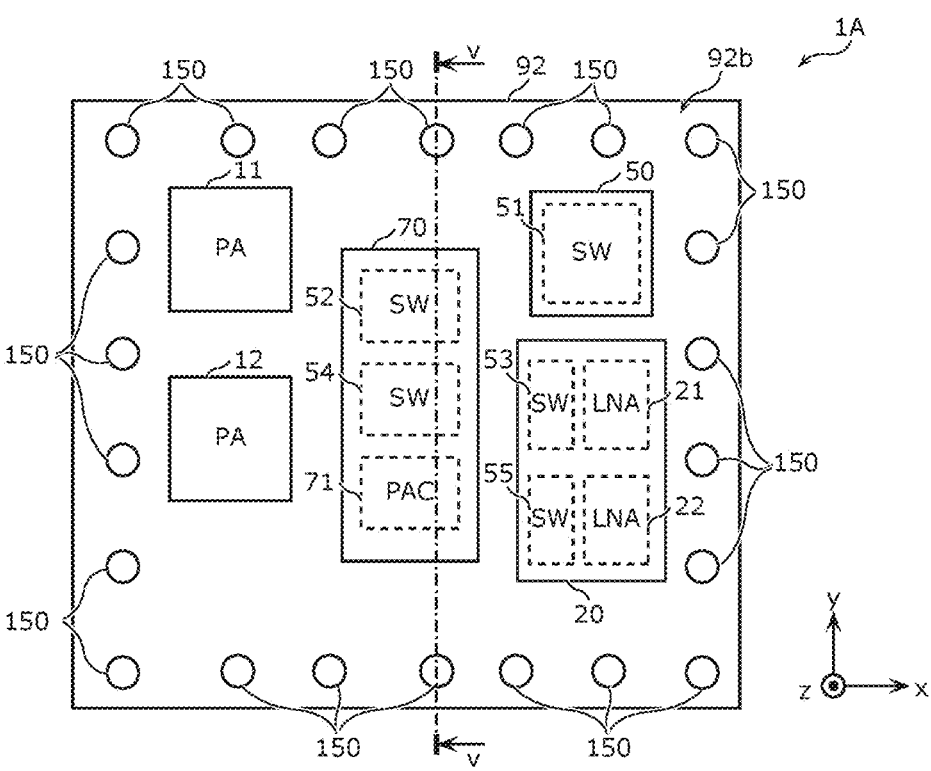
FIG. 4 is a plan view of a fourth major surface of the radio-frequency module according to the Example.
Figure 5:
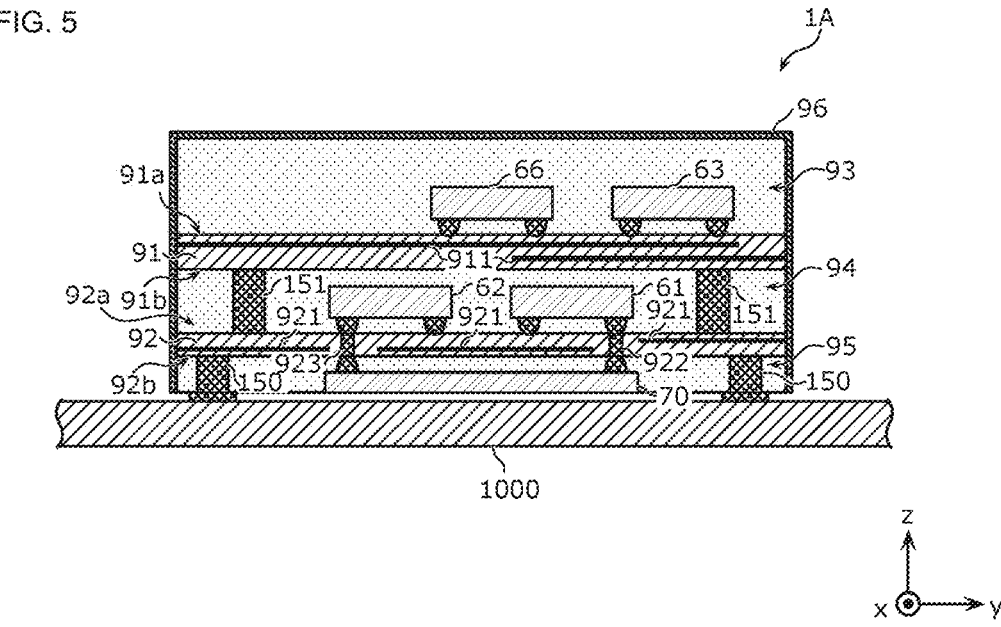
FIG. 5 is a cross-sectional view of the radio-frequency module according to the Example.

FIG. 2 is a plan view of a major surface 91a of the radio-frequency module 1A according to Example 1. FIG. 3 is a plan view of a major surface 92a of the radio-frequency module 1A according to Example 1. FIG. 3 is a view seen through the major surface 92a side of a module substrate 92 as seen in the positive z-axis direction. FIG. 4 is a plan view of a major surface 92b of the radio-frequency module 1A according to Example 1. FIG. 4 is a view seen through the major surface 92b side of a module substrate 92 as seen in the positive z-axis direction. FIG. 5 is a cross-sectional view of the radio-frequency module 1A according to Example 1. The cross section of the radio-frequency module 1A in FIG. 5 is taken along a line v-v of FIGS. 2 to 4.

FIGS. 2 to 5 do not illustrate, except for some part, traces connecting plural electronic components disposed in the module substrates 91 and 92. FIGS. 2 to 4 do not illustrate resin members 93 to 95 covering plural electronic components and a shield electrode layer 96, which covers the surfaces of the resin members 93 to 95.

In addition to the plural electronic components including the plural circuit elements illustrated in FIG. 1, the radio-frequency module 1A includes the module substrates 91 and 92, the resin members 93 to 95, the shield electrode layer 96, plural external connection terminals 150, and plural inter-substrate connection terminals 151.

The module substrate 91 is an example of a first module substrate and includes the major surfaces 91a and 91b, which are opposite to each other. The major surfaces 91a and 91b are examples of first and second major surfaces, respectively. In the module substrate 91, ground electrode patterns 911 are formed. The ground electrode patterns 911 are coupled to ground terminals and are set to the ground potential.

The module substrate 92 is an example of a second module substrate and includes the major surfaces 92a and 92b, which are opposite to each other. The major surfaces 92a and 92b are examples of third and fourth major surfaces, respectively.

Within the module substrate 92, ground electrode patterns 921 and via conductors 922 and 923 are formed. The ground electrode patterns 921 are coupled to ground terminals and are set to the ground potential.

The module substrates 91 and 92 are disposed so that the major surface 91b of the module substrate 91 faces the major surface 92a of the module substrate 92. The module substrates 91 and 92 are disposed at such a distance that the electronic components can be disposed between the major surfaces 91b and 92a. The plural electronic components are disposed in the two module substrates 91 and 92 and, specifically, are separated into three layers: between the major surfaces 91b and 92a; on the major surface 91a; and on the major surface 92b.

In FIGS. 2 to 5, the module substrates 91 and 92 have rectangular shapes of the same size in a planar view. The module substrates 91 and 92 may have different sizes and/or different shapes. The shapes of the module substrates 91 and 92 are not limited to rectangles.

Each of the module substrates 91 and 92 can be, but not limited to, a low temperature co-fired ceramic (LTCC) substrate or a high temperature co-fired ceramic (HTCC) substrate, which includes a laminate structure of plural dielectric layers, an embedded printed circuit board, a substrate including a redistribution layer (RDL), a printed circuit board, or the like, for example.

On the major surface 91*a* (the upper layer), matching networks 401, 411 to 413, 422, 431 to 433, 441 to 443, 452, and 461 to 463, and the filters 63 and 66 are disposed.

Each of the matching networks 401, 411 to 413, 422, 431 to 433, 441 to 443, 452, and 461 to 463 is composed of a chip inductor. The chip inductors are surface mount devices (SMDs) each constituting an inductor. The chip inductors are disposed on the major surface 91*a*. The chip inductors are not disposed either between the major surfaces 91*b* and 92*a* or on the major surface 92*b*. The chip inductors are thus disposed only in the upper layer of the three layers.

Each matching network may include a chip inductor and/or a chip capacitor, and the positions of the chip capacitors are not limited. All the matching networks may or may not be surface-mounted. For example, an inductor and/or a capacitor included in any matching network may be formed within the module substrate 91 and/or 92.

The electronic component including the filter 63 is an example of a sixth electronic component. Each of the electronic components including the respective filters 63 and 66 may be composed of, but not limited to, any one of a surface acoustic wave (SAW) filter, a bulk acoustic wave (BAW) filter, an LC resonance filter, and a dielectric filter, for example.

The height of the electronic components including the filters is lower than that of the chip inductors in FIG. 5, but are not limited thereto. For example, the height of the electronic components including the filters may be the same as or higher than that of the chip inductors. In this case, the electronic components including the filters may be in contact with the shield electrode layer 96. This can enhance heat dissipation of the electronic components including the filters, thus improving the temperature characteristics of the filters.

The resin member 93 covers the major surface 91*a* and the electronic components on the major surface 91*a*. The resin member 93 has a function of enhancing the reliability, including mechanical strength and moisture resistance, of the electronic components on the major surface 91*a*. The resin member 93 may or may not be included in the radio-frequency module 1A.

Between the major surfaces 91*b* and 92*a* (the middle layer), the filters 61, 62, 64, and 65 and the plural inter-substrate connection terminals 151 are disposed. Between the major surfaces 91*b* and 92*a*, the resin member 94 is injected and covers the electronic components disposed between the major surfaces 91*b* and 92*a*.

The electronic component including the filter 61 is an example of a second electronic component. The electronic component including the filter 62 is an example of a third electronic component. Each of the electronic components including the respective filters 61, 62, 64, and 65 may be composed of, but not limited to, any one of a SAW filter, a BAW filter, an LC resonance filter, and a dielectric filter, for example.

The plural electronic components including the respective filters 61, 62, 64, and 65, which are disposed between the major surfaces 91*b* and 92*a*, are electrically coupled to the major surface 92*a* of the module substrate 92 with electrodes interposed therebetween. The electrodes of each electronic component are provided on the side facing the module substrate 92.

The plural inter-substrate connection terminals 151 couple the module substrate 91 to the module substrate 92. Specifically, the plural inter-substrate connection terminals 151 electrically couple the electronic components disposed in the module substrate 91 to the electronic components disposed in the module substrate 92. The inter-substrate connection terminals 151 are composed of copper post electrodes, for example. The shape and material of the inter-substrate connection terminals 151 are not limited thereto.

The resin member 94 covers the major surfaces 91*b* and 92*a* and the electronic components between the major surfaces 91*b* and 92*a*. The resin member 94 has a function of enhancing the reliability, including mechanical strength and moisture resistance, of the electronic components between the major surfaces 91*b* and 92*a*. The resin member 94 does may or may not be included in the radio-frequency module 1A.

On the major surface 92*b* (the lower layer), the power amplifiers 11 and 12, integrated circuits 20, 50, and 70 and the plural external connection terminals 150 are disposed.

The electronic component including the power amplifier 11 is an example of a fourth electronic component. The power amplifiers 11 and 12 are composed of complementary metal oxide semiconductors (CMOSs), for example, and specifically, can be manufactured by a silicon-on-insulator (SOI) process. The power amplifiers 11 and 12 can be thereby manufactured at low cost. The power amplifiers 11 and 12 may be composed of at least one of gallium arsenide (GaAs), silicon germanium (SiGe), and gallium nitride (GaN). This can implement the power amplifiers 11 and 12 of high quality. The semiconductor materials of the power amplifiers 11 and 12 are not limited to the aforementioned materials.

The integrated circuit 20 is an example of a fifth electronic component and includes the low-noise amplifiers 21 and 22 and switches 53 and 55.

The integrated circuit 50 is an example of a seventh electronic component and includes the switch 51. The switch 51 may be included in the integrated circuit 20 or 70.

The integrated circuit 70 is an example of a first electronic component and includes the switches 52 and 54 and PA controller 71. The PA controller 71 is able to control the power amplifiers 11 and 12 upon receiving digital control signals.

At least a part of the integrated circuit 70 (the first electronic component) overlaps at least a part of the electronic component (the second electronic component) including the filter 61 in a planar view. The integrated circuit 70 is coupled to the electronic component including the filter 61 via the via conductor 922 in the module substrate 92.

At least a part of the integrated circuit 70 (the first electronic component) overlaps at least a part of the electronic component (the third electronic component) including the filter 62 in a planar view. The integrated circuit 70 is coupled to the electronic component including the filter 62 via the via conductor 923 in the module substrate 92.

Each of the integrated circuits 20, 50, and 70 is composed of a CMOS, for example, and specifically, may be manufactured by a SOI process. Each of the integrated circuits 20, 50, and 70 may be composed of at least one of GaAs, SiGe, and GaN. The semiconductor materials of the integrated circuits 20, 50, and 70 are not limited to the aforementioned materials.

The set of electronic circuits included in each of the plural electronic components disposed on the major surface 92b is formed on its major surface side that faces the module substrate 92. Each of the plural electronic components can be cut on the side opposite to the major surface in which the set of electronic circuits is formed.

On the major surface 92b, the power amplifiers 11 and 12 and the integrated circuits 20, 50, and 70, which can be formed by cutting, are disposed while the filters 61 to 66 and matching networks (chip inductors) 401, 411 to 413, 422, 431 to 433, 441 to 443, 452, and 461 to 463 are not disposed. The lower surface of the radio-frequency module 1A can be therefore formed by cutting, so that the resin member 95 and the integrated circuits 20, 50, and 70 can be made thinner.

The plural external connection terminals 150 include the antenna connection terminal 100, radio-frequency input terminals 111 and 112, radio-frequency output terminals 121 and 122, and control terminal 131, which are illustrated in FIG. 1, and further include ground terminals. The plural external connection terminals 150 are individually joined to input-output terminals, a ground terminal, and/or other terminals on a motherboard 1000, which is laid in the negative z-axis direction with respect to the radio-frequency module 1A. The plural external connection terminals 150 can be copper post electrodes, for example. However, the shape and material of the external connection terminals 150 are not limited thereto.

The resin member 95 covers the major surface 92b and the electronic components on the major surface 92b. The resin member 95 has a function of enhancing the reliability, including mechanical strength and moisture resistance, of the electronic components on the major surface 92b. The resin member 95 may or may not be included in the radio-frequency module 1A.

The shield electrode layer 96 is a metallic thin film formed by sputtering, for example. The shield electrode layer 96 is formed so as to cover the upper surface of the resin member 93 and lateral faces of the resin members 93 to and module substrates 91 and 92. The shield electrode layer 96 is coupled to the ground and inhibits external noise from entering the electronic components constituting the radio-frequency module 1A. The shield electrode layer 96 may or may not be included in the radio-frequency module 1A.

[2.2 Effect of Radio-Frequency Module 1A]

As described above, the radio-frequency module 1A according to Example 1 includes: the module substrate 91, which includes the major surfaces 91a and 91b opposite to each other; the module substrate 92, which includes the major surfaces 92a and 92b opposite to each other, the major surface 92a being disposed facing the major surface 91b; the plural electronic components disposed between the major surfaces 91b and 92a, on the major surface 91a, and on the major surface 92b; the plural external connection terminals 150, which are disposed on the major surface 92b; and the plural inter-substrate connection terminals 151 disposed between the major surfaces 91b and 92a for coupling the module substrate 91 to the module substrate 92. The plural electronic components include the first electronic component (the integrated circuit 70) including the switch 52, the second electronic component including the filter 61, which is coupled to the power amplifier 11 via the switch 52, and the third electronic component including the filter 62, which is coupled to the power amplifier 11 via the switch 52. The first to third electronic components are disposed in one of the module substrates 91 and 92 (the module substrate 92 in Example 1).

According to such a configuration, the plural electronic components are disposed in three layers, including between the major surfaces 91b and 92a (the middle layer), on the major surface 91a (the upper layer), and on the major surface 92b (the lower layer). This can implement reduction in area of the radio-frequency module 1A in a planar view, that is, reduction in size of the radio-frequency module 1A. The first electronic component (the integrated circuit 70) including the switch 52 and the second and third electronic components including the filters 61 and 62, respectively, which are coupled to the switch 52, are disposed in the same module substrate 92. This can eliminate the need for the inter-substrate connection terminals for coupling the switch 52 to the filters 61 and 62, thus reducing the number of inter-substrate connection terminals 151 required. Furthermore, the trace length between the switch 52 and the filters 61 and 62 can be shortened, and the trace loss and the mismatching loss due to trace variations can be reduced, thus improving the electrical characteristics of the radio-frequency module 1A.

In the radio-frequency module 1A according to Example 1, for example, the first electronic component (the integrated circuit 70) may be disposed on the major surface 92b.

According to such a configuration, even when the integrated circuit 70 including the switch 52 is disposed in the lower layer of the radio-frequency module 1A, the lower layer can be formed by cutting. This can reduce the height of the radio-frequency module 1A.

In the radio-frequency module 1A according to Example 1, for example, the second and third electronic components may be disposed on the major surface 92a.

According to such a configuration, the two electronic components including the filters 61 and 62, respectively, are disposed between the module substrates 91 and 92. This can inhibit external noise from entering the filters 61 and 62.

In the radio-frequency module 1A according to Example 1, for example, at least a part of the first electronic component may overlap at least a part of the second electronic component in a planar view.

This can shorten the distance between the first and second electronic components, thus contributing to reduction in trace length between the switch 52 and the filter 61.

In the radio-frequency module 1A according to Example 1, for example, the first electronic component may be coupled to the second electronic component via the via conductor 922 formed in the module substrate 92.

According to such a configuration, the via conductor 922 can couple between the first and second electronic components, which at least partially overlap each other in a planar view, thus contributing to further reduction in trace length between the switch 52 and the filter 61.

In the radio-frequency module 1A according to Example 1, for example, at least a part of the first electronic component may overlap at least a part of the third electronic component in a planar view.

This can shorten the distance between the first and third electronic components, thus contributing to reduction in trace length between the switch 52 and the filter 62.

In the radio-frequency module 1A according to Example 1, for example, the first electronic component may be coupled to the third electronic component via the via conductor 923 formed in the module substrate 92.

According to such a configuration, the via conductor 923 can couple between the first and third electronic components, which at least partially overlap each other in a planar view, thus contributing to further reduction in trace length between the switch 52 and the filter 62.

In the radio-frequency module 1A according to Example 1, for example, the plural electronic components may include the fourth electronic component including the power amplifier 11, and the fourth electronic component may be disposed in the module substrate 92 same as the first electronic component.

According to such a configuration, the fourth electronic component including the power amplifier 11 coupled to the switch 52 is disposed in the module substrate 92 same as the first electronic component (the integrated circuit 70) including the switch 52. This can eliminate the need for the inter-substrate connection terminals for coupling the switch 52 to the power amplifier 11, thus reducing the number of inter-substrate connection terminals 151 required. Furthermore, the trace length between the switch 52 and the power amplifier 11 can be shortened, and the trace loss and the mismatching loss due to trace variations can be reduced, thus improving the electrical characteristics of the radio-frequency module 1A.

In the radio-frequency module 1A according to Example 1, for example, the fourth electronic component may be disposed on the major surface 92b.

According to such a configuration, even when the fourth electronic component including the power amplifier 11 is disposed in the lower layer of the radio-frequency module 1A, the lower layer can be formed by cutting. This can reduce the height of the radio-frequency module 1A.

In the radio-frequency module 1A according to Example 1, for example, the filter 62 may be coupled to the low-noise amplifier 21 via the switch 52.

According to such a configuration, the switch 52 can be used to switch the coupling of the power amplifier 11 between the two filters 61 and 62 and/or to switch the coupling of the filter 62 having the band B for TDD between the power amplifier 11 and the low-noise amplifier 21.

In the radio-frequency module 1A according to Example 1, for example, the low-noise amplifier 21 may be coupled to the filter 63 via the switch 53 and may be coupled to the filter 62 via the switches 53 and 52.

The low-noise amplifier 21 can be thus coupled to the filters 62 and 63 and shared by the two bands. This can reduce the number of low-noise amplifiers required, thus contributing to reduction in size of the radio-frequency module 1A.

In the radio-frequency module 1A according to Example 1, for example, the plural electronic components may include the fifth electronic component (the integrated circuit 20) including the switch 53, and the fifth electronic component may be disposed in the module substrate same as the first electronic component.

According to such a configuration, the fifth electronic component including the switch 53 coupled to the switch 52 is disposed in the module substrate 92 same as the first electronic component (the integrated circuit 70) including the switch 52. This can eliminate the need for the inter-substrate connection terminals for coupling the switch 52 to the switch 53, thus reducing the number of inter-substrate connection terminals 151 required. Furthermore, the trace length between the switches 52 and 53 can be shortened, and the trace loss and the mismatching loss due to trace variations can be reduced, thus improving the electrical characteristics of the radio-frequency module 1A.

In the radio-frequency module 1A according to Example 1, for example, the fifth electronic component (the integrated circuit 20) may include the low-noise amplifier 21.

According to such a configuration, the switch 53 and the low-noise amplifier 21 are included in the single integrated circuit 20. This can reduce the number of components, thus contributing to reduction in size of the radio-frequency module 1A.

In the radio-frequency module 1A according to Example 1, for example, the fifth electronic component (the integrated circuit 20) may be disposed on the major surface 92b.

According to such a configuration, even when the integrated circuit 20 including the low-noise amplifier 21 is disposed in the lower layer of the radio-frequency module 1A, the lower layer can be formed by cutting. This can reduce the height of the radio-frequency module 1A.

In the radio-frequency module 1A according to Example 1, for example, the plural electronic components may include the sixth electronic component including the filter 63, and the sixth electronic component may be disposed on the major surface 91a.

According to such a configuration, the sixth electronic component including the filter 63 can be disposed on the major surface 91a, thus implementing well-balanced positions of the plural electronic components in three layers.

In the radio-frequency module 1A according to Example 1, for example, the plural electronic components may include the seventh electronic component (the integrated circuit 70) including the switch 51 coupled between the filters 61 to 63 and the antenna connection terminal 100, and the seventh electronic component may be disposed on the major surface 92b.

According to such a configuration, the switch 51 can be disposed in the vicinity of the external connection terminals 150 serving as ground terminals. This can release distortion generated in the switch 51 out of the radio-frequency module 1A through the nearby ground terminals, thus improving the signal quality.

In the radio-frequency module 1A according to Example 1, for example, the filter 61 may have the pass band including the uplink operation band of the band A for FDD. The filter 62 may have the pass band including the band B for TDD. The filter 63 may have the pass band including the downlink operation band of the band A for FDD.

The radio-frequency module 1A is thus compatible with both the band for FDD and the band for TDD.

In the radio-frequency module 1A according to Example 1, for example, the first electronic component (the integrated circuit 70) may include the PA controller 71 that controls the power amplifier 11.

According to such a configuration, the switch 52 and the PA controller 71 are included in the single integrated circuit 70. This can reduce the number of components, thus contributing to reduction in size of the radio-frequency module 1A.

The communication device 5 according to Example 1 includes: the RFIC 3 that processes radio-frequency signals; and the radio-frequency module 1A that transmits radio-frequency signals between the RFIC 3 and the antenna 2.

According to such a configuration, the communication device 5 can achieve the effect of the radio-frequency module 1A.

(Modification)

The radio-frequency module and communication device according to the present disclosure are described based on the embodiment and examples hereinabove but are not limited to the aforementioned embodiment and examples. The present disclosure includes another example implemented by a combination of any constituent elements of the aforementioned examples, modifications obtained by performing for the aforementioned embodiment and examples, various changes that can be conceived by those skilled in the art without departing from the spirit of the present disclosure, and various devices incorporating the aforementioned radio-frequency module.

In the circuit configurations of the radio-frequency circuit and communication device according to the aforementioned embodiments, for example, other circuit elements, traces, and the like may be inserted in paths connecting circuit elements and signal paths disclosed in the drawings. For example, a matching network may be inserted between the switch 51 and the filter 62 and/or between the switch 51 and the filter 65.

In the aforementioned embodiment, the filter 61 having the pass band including the uplink operation band of the band A for FDD is used as the first filter, but the first filter is not limited thereto. For example, the filter having the pass band including the band for TDD may be used as the first filter.

In the aforementioned embodiment, the filter 62 having the pass band including the band B for TDD is used as the second filter, but the second filter is not limited thereto. For example, the filter having the pass band including the uplink operation band of the band for FDD may be used as the second filter.

The positions of the plural electronic components are illustrated in the aforementioned examples by way of example and are not limited to the aforementioned examples. For example, in the aforementioned examples, the first electronic component (the integrated circuit 70) including the switch 52, the second electronic component including the filter 61, and the third electronic component including the filter 62 may be disposed in the module substrate 91, instead of the module substrate 92.

In the aforementioned examples, the first electronic component and the second and third electronic components are disposed on the major surfaces opposite to each other, but are not limited to these positions. For example, the first electronic component and the second electronic component and/or third electronic component may be disposed on the same major surface of the same module substrate. Alternatively, the second and third electronic components may be disposed on the major surfaces of the same module substrate, which are opposite to each other.

The external connection terminals 150 are composed of copper post electrodes in the aforementioned examples but are not limited thereto. For example, the external connection terminals 150 may be bump electrodes. In this case, the radio-frequency module may or may not include the resin member 95.

The switch 51 is included in the integrated circuit 50 in the aforementioned Examples, but is not limited thereto. For example, the switch 51 may be included in the integrated circuit 20. In addition to the low-noise amplifier 21 and the switch 53, the switch 51 is thus included in the integrated circuit 20. This can reduce the number of components, thus contributing to reduction in size of the radio-frequency module 1A.

INDUSTRIAL APPLICABILITY

The present disclosure can be widely used in communication devices, including mobile phones, as a radio-frequency module provided in the front end.

18

REFERENCE SIGNS LIST

1 RADIO-FREQUENCY CIRCUIT
1A RADIO-FREQUENCY MODULE
2 ANTENNA
3 RFIC
4 BBIC
5 COMMUNICATION DEVICE
11, 12 POWER AMPLIFIER
50, 70 INTEGRATED CIRCUIT
21, 22 LOW-NOISE AMPLIFIER
51, 52, 53, 54, 55 SWITCH
61, 62, 63, 64, 65, 66 FILTER
71 PA CONTROLLER
91, 92 MODULE SUBSTRATE
91a, 91b, 92a, 92b MAJOR SURFACE
93, 94, 95 RESIN MEMBER
96 SHIELD ELECTRODE LAYER
100 ANTENNA CONNECTION TERMINAL
111, 112 RADIO-FREQUENCY INPUT TERMINAL
121, 122 RADIO-FREQUENCY OUTPUT TERMINAL
131 CONTROL TERMINAL
150 EXTERNAL CONNECTION TERMINAL
151 INTER-SUBSTRATE CONNECTION TERMINAL
401, 411, 412, 413, 422, 431, 432, 433, 441, 442, 443, 452, 461, 462, 463 MATCHING NETWORK
511, 512, 513, 514, 515, 516, 517, 521, 522, 523, 524, 531, 532, 533, 541, 542, 543, 544, 551, 552, 553 TERMINAL
911, 921 GROUND ELECTRODE PATTERN
922, 923 VIA CONDUCTOR
1000 MOTHERBOARD

The invention claimed is:

1. A radio-frequency module, comprising:
a first module substrate including a first major surface and a second major surface that are opposite to each other;
a second module substrate including a third major surface and a fourth major surface that are opposite to each other, the third major surface being disposed facing the second major surface;
a plurality of electronic components disposed between the second major surface and the third major surface, on the first major surface, and on the fourth major surface;
a plurality of external connection terminals disposed on the fourth major surface; and
a plurality of inter-substrate connection terminals disposed between the second major surface and the third major surface to couple the first module substrate to the second module substrate, wherein
the plurality of electronic components include
a first electronic component including a first switch,
a second electronic component including a first filter coupled to a power amplifier via the first switch,
a third electronic component including a second filter coupled to the power amplifier via the first switch, and
a fourth electronic component including the power amplifier
the first electronic component, the second electronic component, the third electronic component, and the fourth electronic component are disposed in one of the first module substrate and the second module substrate, and
the fourth electronic component is disposed in the module substrate same as the first electronic component.
2. The radio-frequency module according to claim 1, wherein the first electronic component is disposed on the fourth major surface.

3. The radio-frequency module according to claim 2, wherein the second electronic component and the third electronic component are disposed on the third major surface.

4. The radio-frequency module according to claim 3, wherein at least a part of the first electronic component overlaps at least a part of the second electronic component in a planar view.

5. The radio-frequency module according to claim 4, wherein the first electronic component is coupled to the second electronic component via a via conductor formed in the second module substrate.

6. The radio-frequency module according to claim 5, wherein at least a part of the first electronic component overlaps at least a part of the third electronic component in a planar view.

7. The radio-frequency module according to claim 6, wherein the first electronic component is coupled to the third electronic component via a via conductor formed in the second module substrate.

8. The radio-frequency module according to claim 1, wherein the fourth electronic component is disposed on the fourth major surface.

9. The radio-frequency module according to claim 8, wherein the second filter is coupled to a low-noise amplifier via the first switch.

10. The radio-frequency module according to claim 9, wherein the low-noise amplifier is coupled to a third filter via a third switch and coupled to the second filter via the third switch and the first switch.

11. The radio-frequency module according to claim 10, wherein the plurality of electronic components include a fifth electronic component including the third switch, and the fifth electronic component is disposed in the module substrate same as the first electronic component.

12. The radio-frequency module according to claim 11, wherein the fifth electronic component includes the low-noise amplifier.

13. The radio-frequency module according to claim 12, wherein the fifth electronic component is disposed on the fourth major surface.

14. The radio-frequency module according to claim 11, wherein the plurality of electronic components include a sixth electronic component including the third filter, and the sixth electronic component is disposed on the first major surface.

15. The radio-frequency module according to claim 14, wherein the plurality of electronic components include a seventh electronic component including a second switch coupled between the first to third filters and an antenna connection terminal, and the seventh electronic component is disposed on the fourth major surface.

16. The radio-frequency module according to claim 11, wherein the fifth electronic component includes a second switch coupled between the first to third filters and an antenna connection terminal.

17. The radio-frequency module according to claim 16, wherein the first filter has a pass band including an uplink operation band of a band for frequency division duplex, the second filter has a pass band including a band for time division duplex, and the third filter has a pass band including a downlink operation band of the band for frequency division duplex.

18. The radio-frequency module according to claim 17, wherein the first electronic component includes a PA controller that controls the power amplifier.

19. A communication device comprising:

a signal processing circuit that processes radio-frequency signals; and the radio-frequency module according to claim 1 that transmits the radio-frequency signals between the signal processing circuit and an antenna.

20. The radio-frequency module according to claim 1, wherein at least one of the second electronic component and the third electronic component is in contact with a shield electrode layer.

* * * * *